US008971092B2

(12) United States Patent
Kobayashi et al.

(10) Patent No.: US 8,971,092 B2
(45) Date of Patent: Mar. 3, 2015

(54) SEMICONDUCTOR MEMORY DEVICE (71) Applicant: Kabushiki Kaisha Toshiba, Minato-ku (JP)

(72) Inventors: Shigeki Kobayashi, Kuwana (JP);
Yasuhiro Nojiri, Yokohama (JP);
Masaki Yamato, Yokkaichi (JP);
Hiroyuki Fukumizu, Yokohama (JP);
Takeshi Yamaguchi, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/021,052

(22) Filed: Sep. 9, 2013

(65) Prior Publication Data
US 2014/0241037 A1   Aug. 28, 2014

Related U.S. Application Data (60) Provisional application No. 61/770,561, filed on Feb. 28, 2013.

(51) Int. Cl.
*G11C 11/00*   (2006.01)
*G11C 13/00*   (2006.01)
*G11C 19/00*   (2006.01)

(52) U.S. Cl.
CPC ........ *G11C 13/0007* (2013.01); *G11C 13/0069* (2013.01); *G11C 13/0023* (2013.01); *G11C 13/0038* (2013.01); *G11C 19/00* (2013.01); *G11C 2213/71* (2013.01)
USPC ......................................... 365/148; 365/163

(58) Field of Classification Search
CPC ................................................... G11C 13/0069
USPC ........................................................... 365/148
See application file for complete search history.

(56) References Cited

U.S. PATENT DOCUMENTS

| 7,551,487 B2 * | 6/2009 | Park et al. ................ 365/185.22 |
| 7,910,914 B2 | 3/2011 | Tanaka et al. |
| 8,030,700 B2 | 10/2011 | Sakamoto |
| 8,120,006 B2 | 2/2012 | Kim et al. |

(Continued)

FOREIGN PATENT DOCUMENTS

| JP | 2000-100184 | 4/2000 |
| JP | 2007-95131 | 4/2007 |

(Continued)

OTHER PUBLICATIONS

U.S. Appl. No. 14/026,204, filed Sep. 13, 2013, Yamato, et al.

*Primary Examiner* — Son Mai
(74) *Attorney, Agent, or Firm* — Oblon, Spivak, McClelland, Maier & Neustadt, L.L.P.

(57) ABSTRACT

A memory cell array includes first wiring lines, and second wiring lines, the first and second wiring lines intersecting, and memory cells disposed in the intersections of the first and second wiring lines, the memory cells including a variable resistance element. A control circuit controls voltages of selected first and second wiring lines. The first wiring lines are arranged at a first pitch in a first direction perpendicular to a substrate and extend in a second direction parallel to the substrate. The second wiring lines are arranged at a second pitch in the second direction and extend in the first direction. The control circuit is configured to change voltages applied to a selected first wiring line according to the positions of the selected first wiring lines in the first direction.

15 Claims, 6 Drawing Sheets

(56) References Cited

U.S. PATENT DOCUMENTS

| | | |
|---|---|---|
| 8,124,968 B2 | 2/2012 | Koo et al. |
| 8,194,434 B2 * | 6/2012 | Toda .............................. 365/148 |
| 8,299,571 B2 | 10/2012 | Ozawa et al. |
| 8,422,270 B2 * | 4/2013 | Kawabata et al. ............ 365/148 |
| 8,427,878 B2 * | 4/2013 | Shim et al. ................ 365/185.23 |
| 8,730,738 B2 * | 5/2014 | Oh et al. .................. 365/185.22 |
| 2007/0070710 A1 | 3/2007 | Takenaka |
| 2008/0175032 A1 | 7/2008 | Tanaka et al. |
| 2009/0321878 A1 | 12/2009 | Koo et al. |
| 2010/0019310 A1 | 1/2010 | Sakamoto |
| 2010/0072452 A1 | 3/2010 | Kim et al. |
| 2011/0140068 A1 | 6/2011 | Ozawa et al. |
| 2013/0107629 A1 * | 5/2013 | Shim et al. ................ 365/185.17 |

FOREIGN PATENT DOCUMENTS

| | | |
|---|---|---|
| JP | 2008-181978 | 8/2008 |
| JP | 2009-301691 | 12/2009 |
| JP | 2010-10688 | 1/2010 |
| JP | 2010-34112 | 2/2010 |
| JP | 2010-74169 | 4/2010 |
| JP | 2011-23645 | 2/2011 |
| JP | 2011-129639 | 6/2011 |

* cited by examiner

CODE LENGTH OF ONE DATA SET
(LIVE DATA + PARITY DATA)

01011....0110 101......1101

WRITTEN IN MEMORY
CELLS CONNECTED
TO WL1 (UPPER BITS)

WRITTEN IN MEMORY
CELLS CONNECTED
TO WL2 (LOWER BITS)

SEMICONDUCTOR MEMORY DEVICE

CROSS REFERENCE TO RELATED APPLICATIONS

This application is based on and claims the benefit of priority from prior U.S. prior provisional Patent Application No. 61/770,561, filed on Feb. 28, 2013, the entire contents of which are incorporated herein by reference.

FIELD

The embodiments herein relate to a semiconductor memory device.

BACKGROUND

As recent semiconductor memory devices become more integrated, the associated LSI devices become increasingly more compact. The more compact LSI devices request not only a smaller line width, but improved dimension and position accuracies of the circuit patterns. So, a Resistive RAM (ReRAM) is proposed that uses, as a memory, a variable resistance element that reversibly changes the resistance. Then, it is believed that the memory cell array can become more highly integrated by a structure of the ReRAM in which the variable resistance element is provided between side walls of word-lines extending in parallel with a substrate and side walls of bit-lines extending perpendicular to the substrate. Unfortunately, during the manufacturing process, the ReRAM has variation in its characteristics.

BRIEF DESCRIPTION OF THE DRAWINGS

FIG. 5 is a figure when FIG. 4 is viewed from the X direction.

DETAILED DESCRIPTION

A semiconductor memory device according to the embodiments described below includes a memory cell array and a control circuit. The memory cell array includes first wiring lines, and second wiring lines, the first and second wiring lines intersecting, and memory cells disposed in the intersections of the first and second wiring lines, the memory cells including a variable resistance element. A control circuit controls the voltages of selected first and second wiring lines. The first wiring lines are arranged at a first pitch in a first direction perpendicular to a substrate and extend in a second direction parallel to the substrate. The second wiring lines are arranged at a second pitch in the second direction and extend in the first direction. The control circuit is configured to change the voltages applied to a first wiring line of the first wiring lines e according to the position of the selected wiring line in the first direction.

[First Embodiment]

Figure 1:
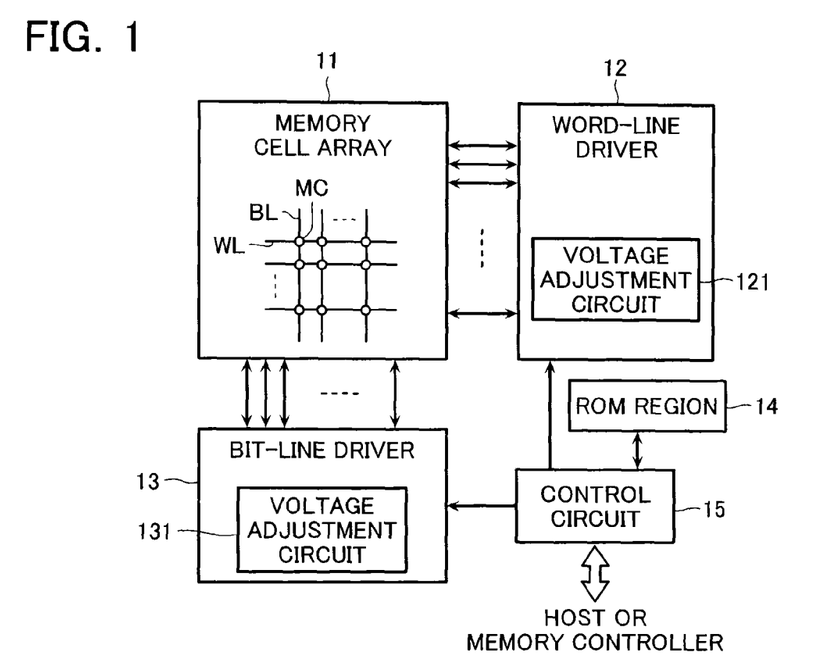
FIG. 1 is an example block diagram of a semiconductor memory device according to a first embodiment.

First, the entire configuration of a semiconductor memory device according to a first embodiment will be described. FIG. 1 is an example block diagram of a semiconductor memory device according to a first embodiment. With reference to FIG. 1, the semiconductor memory device includes a memory cell array 11, a word-line driver 12, a bit-line driver 13, a ROM region 14, and a control circuit 15.

The memory cell array 11 includes word-lines WL and bit-lines BL, which intersect each other, and memory cells MC disposed in the intersections thereof. The word-line driver 12 selects a word-line WL when accessing (data erase/write/read/forming). The word-line driver 12 includes a voltage adjustment circuit 121 to adjust a voltage applied to each word-line WL. The bit-line driver 13 selects a bit-line BL when accessing, and reads data according to the voltage of the bit-line BL. The bit-line driver 13 includes a voltage adjustment circuit 131 to adjust a voltage applied to each bit-line BL.

The ROM region 14 stores the result of a test write or the like. The control circuit 15 may control the word-line driver 12, the bit-line driver 13, and the ROM region 14. The control circuit 15 may also control the voltage adjustment circuit 121 and the voltage adjustment circuit 131. The semiconductor memory device operates by receiving a set or reset command and an address or the like from a host or memory controller.

Figure 2:
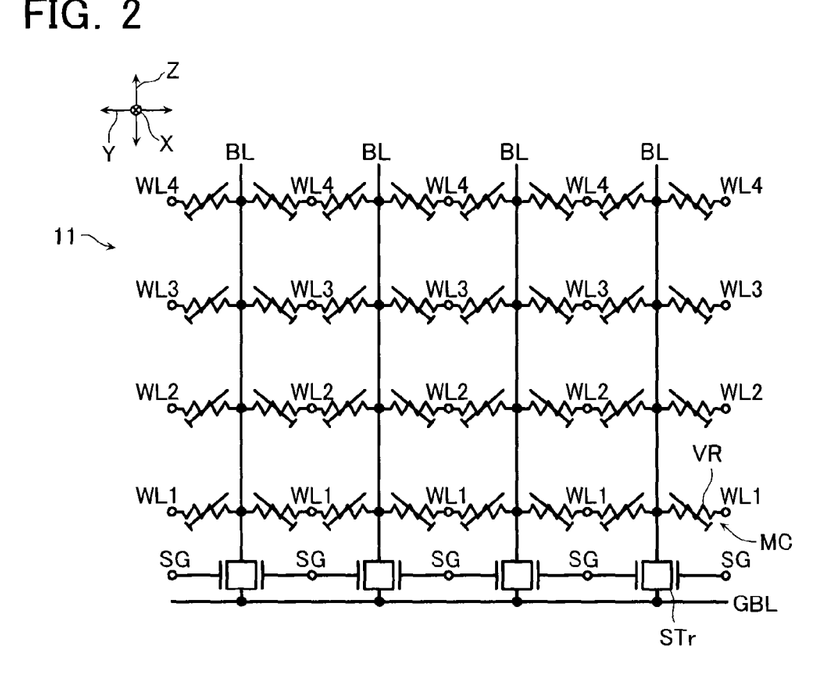
FIG. 2 is an example circuit diagram of a memory cell array 11 according to the first embodiment.

With reference now to FIG. 2, the memory cell array 11 according to the first embodiment will be described in more detail. FIG. 2 is an example circuit diagram of the memory cell array 11. Note that in FIG. 2, the X direction, the Y direction, and the Z direction are perpendicular to each other, and the X direction is a direction perpendicular to the plane. In addition, the structure shown in FIG. 2 is repeated in the X direction.

With reference to FIG. 2, the memory cell array 11 includes, in addition to the word-lines WL, the bit-lines BL, and the memory cells MC, selection transistors STr, global bit-lines GBL, and select gate lines SG.

With reference to FIG. 2, the word lines WL1 to WL4 are arranged at a predetermined pitch in the Z direction and extend in the X direction. The bit-lines BL are arranged in a matrix in the X and Y directions and extend in the Z direction. The memory cells MC are disposed at the intersections of the word-lines WL and the bit-lines BL. Therefore, the memory cells MC are arranged in a three-dimensional matrix in the X, Y, and Z directions.

With reference to FIG. 2, each memory cell MC includes a variable resistance element VR. The variable resistance element VR is electrically rewritable and may store data in a non-volatile manner according to its resistance. The variable resistance element VR is changed from a high resistance state (reset state) to a low resistance state (set state) by a set operation that applies a certain or higher voltage across the element VR. The variable resistance element VR is also changed from the low resistance state (set state) to the high resistance state (reset state) by a reset operation that applies a certain or higher voltage across the element VR. In addition, most of the variable resistance elements including a metal oxide film have, immediately after the manufacture, difficulty to change their resistance state and are in the high resistance state. Then, a forming operation is performed that applies a high voltage across the variable resistance element VR, the voltage being equal to or higher than the set and reset operation voltages. The forming operation locally forms a region (filament path) in the variable resistance element VR that easily conducts current. The variable resistance element VR may thus easily change its resistance state and thus be operatable as a memory element.

With reference to FIG. 2, each select transistor STr is provided between a first end of a bit-line BL and one of the global bit-lines GBL. The global bit lines GBL are arranged at a predetermined pitch in the X direction and extend in the Y direction. One global bit-line GBL is commonly connected to one ends of a series of select transistors STr aligned in the Y direction. The select gate lines SG are arranged at a predetermined pitch in the Y direction and extend in the X direction. One select gate line SG is commonly connected to the gates of a series of select transistors STr aligned in the X direction.

Figure 3:
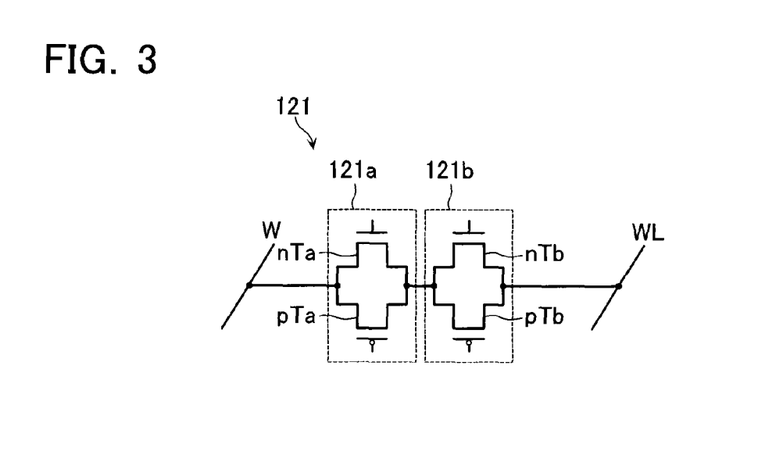
FIG. 3 is an example circuit diagram of a voltage adjustment circuit 121 according to the first embodiment.

With reference now to FIG. 3, a specific configuration of the voltage adjustment circuit 121 will be described. Note that the voltage adjustment circuit 131 has a similar configuration to the voltage adjustment circuit 121, and its description is omitted here. With reference to FIG. 3, the voltage adjustment circuit 121 includes path circuits 121a and 121b provided between a wiring line W to be supplied with a voltage and a word-line WL. The path circuit 121a includes an n-type transistor nTa and a p-type transistor pTa connected in parallel. Likewise, the path circuit 121b includes an n-type transistor nTb and a p-type transistor pTb connected in parallel. When a voltage is transferred to a word-line WL, the control circuit 15 renders the path circuit 121a conductive. Then, when a voltage is transferred to a word-line WL, the control circuit 15 changes the voltages applied to the gates of the n-type transistor nTb and the p-type transistor pTb in the path circuit 121b for each of the word-lines WL1 to WL4. That is, the path circuit 121b changes the voltage drop for each of the word-lines WL1 to WL4 to transfer the voltage of the wiring line W to the word-lines WL1 to WL4. Thus, the voltage adjustment circuit 121 may adjust the voltage applied to each word-line WL.

Figure 4:
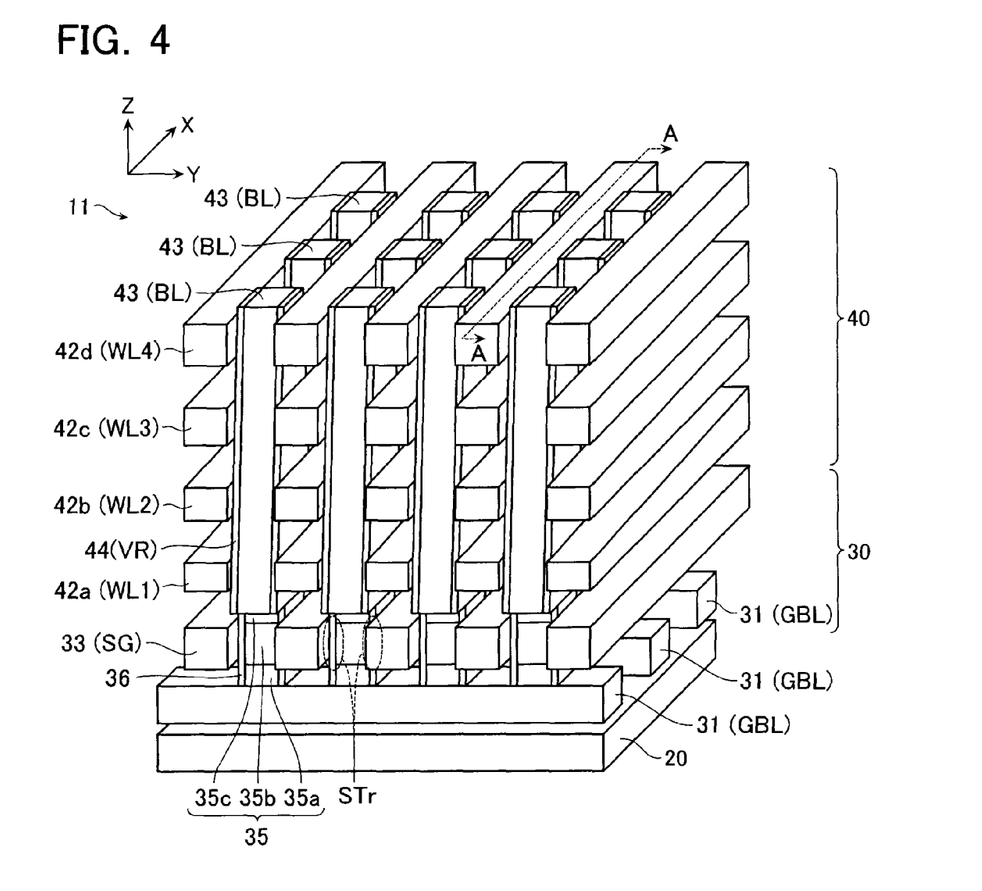
FIG. 4 is an example perspective view of a stacked structure of the memory cell array 11 according to the first embodiment.
Figure 5:
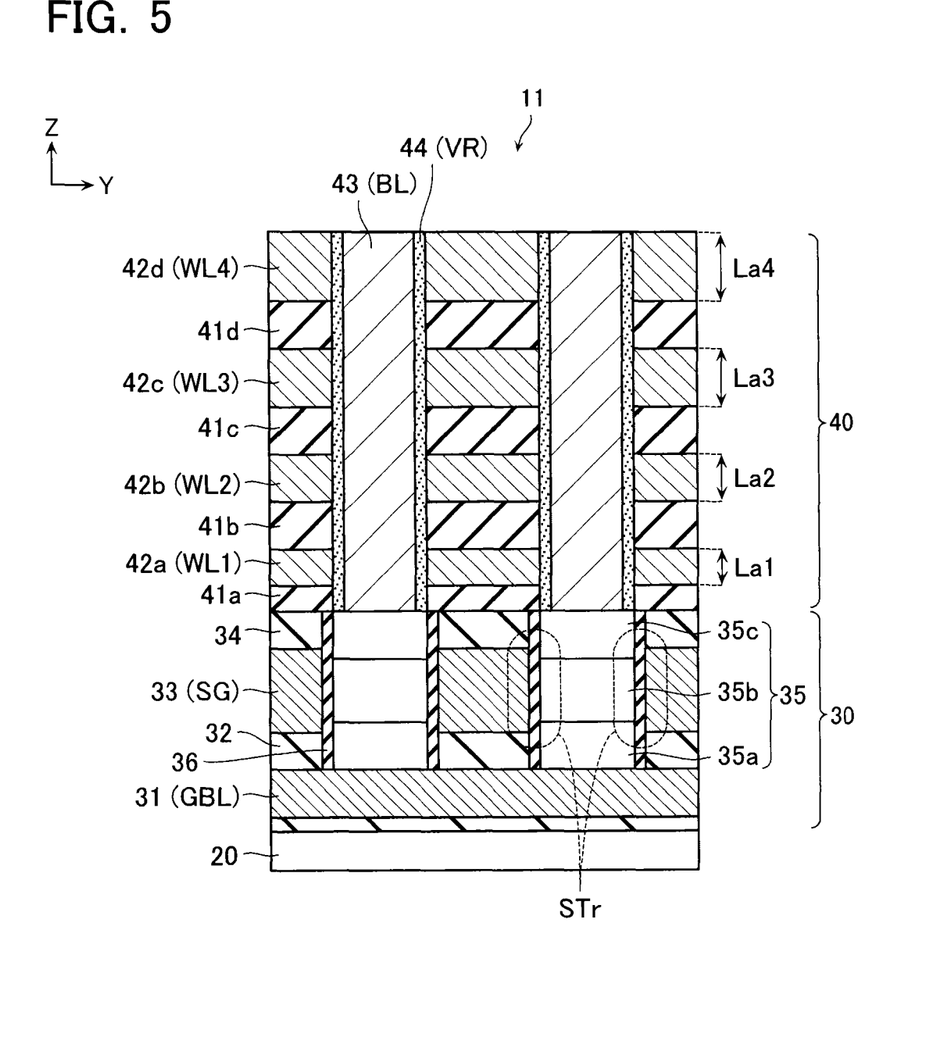
Figure 6:
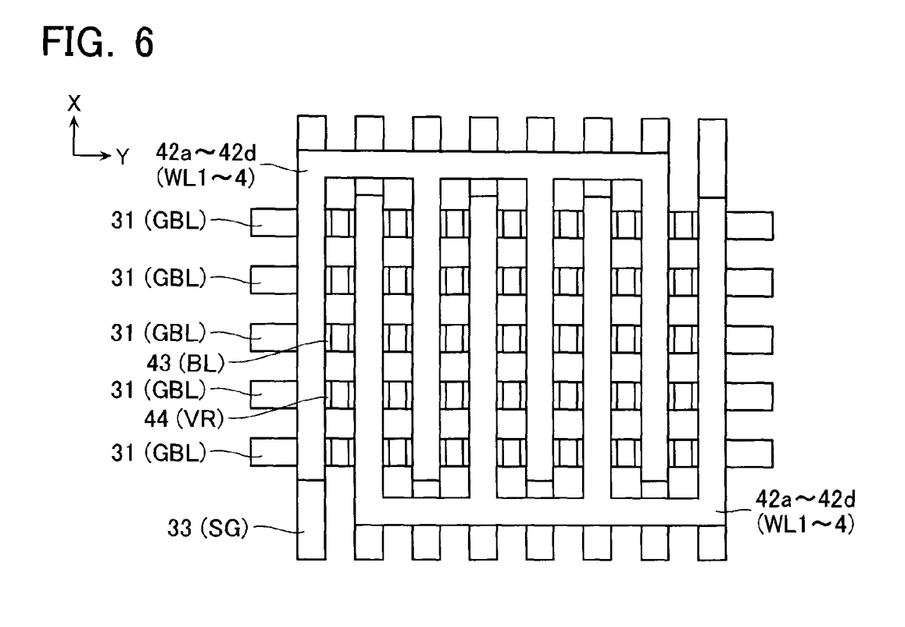
FIG. 6 is a top view of FIG. 4.

With reference now to FIG. 4, FIG. 5 and FIG. 6, a stacked structure of the memory cell array 11 according to the first embodiment will be described. FIG. 4 is an example perspective view of the stacked structure of the memory cell array 11. FIG. 5 is a figure when FIG. 4 is viewed from the X direction (Z-Y plan view). FIG. 6 is a top view of FIG. 4. Note that FIGS. 4 and 6 omit the interlayer insulating layers.

With reference to FIGS. 4 and 5, the memory cell array 11 includes a selection transistor layer 30, and a memory layer 40, which are stacked on a substrate 20. The selection transistor layer 30 includes selection transistors STr disposed therein. The memory layer 40 includes memory cells MC disposed therein.

With reference to FIGS. 4 and 5, the selection transistor layer 30 includes conductive layers 31, interlayer insulating layers 32, conductive layers 33, and interlayer insulating layers 34. The conductive layers 31, the interlayer insulating layers 32, the conductive layers 33, and the interlayer insulating layers 34 are stacked in the Z direction perpendicular to the substrate 20. The conductive layers 31 function as the global bit-lines GBL. The conductive layers 33 function as the select gate lines SG and the gates of the selection transistors STr.

The conductive layers 31 are arranged at a predetermined pitch in the X direction parallel to the substrate 20 and extend in the Y direction (see FIG. 6). The interlayer insulating layers 32 cover the upper surfaces of the conductive layers 31. The conductive layers 33 are arranged at a predetermined pitch in the Y direction and extend in the X direction (see FIG. 6). The interlayer insulating layers 34 cover the side surfaces and the upper surfaces of the conductive layers 33. The conductive layers 31 and 33 are made of polysilicon, for example. The interlayer insulating layers 32 and 34 are made of silicon dioxide ($SiO_2$).

In addition, with reference to FIGS. 4 and 5, the selection transistor layer 30 includes columnar semiconductor layers 35 and gate insulating layers 36. The columnar semiconductor layers 35 function as the bodies (channels) of the selection transistors STr. The gate insulating layers 36 function as the gate-insulating films of the selection transistors STr.

The columnar semiconductor layers 35 are disposed in a matrix in the X and Y directions and extend in a columnar shape in the Z direction. In addition, the columnar semiconductor layers 35 are in contact with the upper surfaces of the conductive layers 31. The columnar semiconductor layers 35 are also in contact with the Y-direction side surfaces of the conductive layers 33 via the gate insulating layers 36. Then, each columnar semiconductor layer 35 includes a stack of an N-type semiconductor layer 35a, a P-type semiconductor layer 35b, and an N-type semiconductor layer 35c.

With reference to FIGS. 4 and 5, the N type semiconductor layer 35a is in contact, on its Y-direction side surfaces, with the interlayer-insulating layers 32. The P type semiconductor layer 35b is in contact, on its Y-direction side surfaces, with the side surfaces of the conductive layers 33. The N type semiconductor layer 35c is in contact, on its Y-direction side surfaces, with the interlayer-insulating layers 34. The N type semiconductor layers 35a and 35c are made of N type impurity-implanted polysilicon. The P type semiconductor layer 35b is made of P type impurity-implanted polysilicon. The gate insulating layers 36 are made of silicon dioxide ($SiO_2$), for example.

With reference to FIGS. 4 and 5, the memory layer 40 includes an alternating stack of, in the Z direction, interlayer insulating layers 41a to 41d and conductive layers 42a to 42d. The conductive layers 42a to 42d function as the word-lines WL1 to WL4, respectively. Each of the conductive layers 42a to 42d includes a pair of comb shapes opposite in the X direction (see FIG. 6). The interlayer insulating layers 41a to 41d are made of silicon dioxide ($SiO_2$), for example. The conductive layers 42a to 42d are made of polysilicon, silicide, or metal, for example.

The conductive layers 42a to 42d may have different thicknesses. For example, according to this embodiment, as shown in FIG. 5, the upper layers of the conductive layers 42a to 42d have larger Z-direction thicknesses. Specifically, a Z-direction thickness La4 of the conductive layer 42d is larger than a Z-direction thickness La3 of the conductive layer 42c, which is lower than the conductive layer 42d. Likewise, the Z-direction thickness La3 of the conductive layer 42c is larger than a Z-direction thickness La2 of the conductive layer 42b, which is lower than the conductive layer 42c. In addition, the Z-direction thickness La2 of the conductive layer 42b is larger than a Z-direction thickness La1 of the conductive layer 42a, which is lower than the conductive layer 42b.

With reference to FIGS. 4 and 5, the memory layer 40 also includes column conductive layers 43 and variable resistance layers 44. The column conductive layers 43 function as the bit lines BL. The variable resistance layers 44 function as the variable resistance elements VR.

The column conductive layers 43 are disposed in a matrix in the X and Y directions. The column conductive layers 43 are in contact with the upper surfaces of the columnar semiconductor layers 35 and extend in a columnar shape in the Z direction. The variable resistance layers 44 are provided between the Y-direction side surfaces of the column conductive layers 43 and the Y-direction side surfaces of the interlayer insulating layers 41a to 41d. The variable resistance layers 44 are also provided between the Y-direction side surfaces of the column conductive layers 43 and the Y-direction side surfaces of the conductive layers 42a to 42d. The column conductive layers 43 are made of impurity ions implanted polysilicon, for example. The variable resistance layers 44 are made of metal oxide (such as $HfO_x$, $Al_2O_x$, $TiO_x$, $NiO_x$, $WO_x$, and $Ta_2O_x$), for example.

Figure 7:
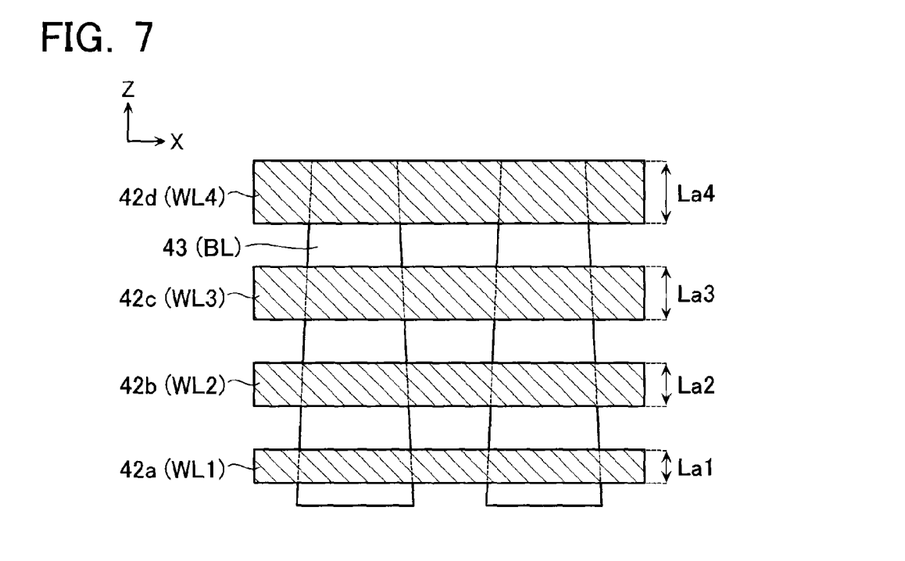
FIG. 7 is a cross-sectional view cut along the A-A line in FIG. 4.

With reference now to FIG. 7, the shapes of the columnar semiconductor layers 43 and the conductive layers 42a to 42d will be described more specifically. FIG. 7 is a cross-sectional view (Z-X plan view) cut along the A-A line in FIG. 4. Note that FIG. 7 omits the interlayer insulating layers 41a to 41d and the variable resistance layers 44.

With reference to FIG. 7, each columnar semiconductor layer 43 is formed in a tapered shape when viewed in the Y direction. That is, the X-direction width of the Y-direction side surface of each columnar semiconductor layer 43 increases when moving in the −Z direction (downward in FIG. 7). The tapered shape of each columnar semiconductor layer 43 may be formed by adjusting the etching condition in the manufacture. As described above, in this embodiment, the upper layers of the conductive layers 42a to 42d have larger Z-direction thicknesses. Here, if the conductive layers 42a to 42d have a uniform Z-direction thickness, the conductive layer 42a and each columnar semiconductor layer 43 have the maximum facing area and the conductive layer 42d and each columnar semiconductor layer 43 have the minimum facing area. Thus, the variable resistance elements VR formed between the conductive layers 42a to 42d (word lines WL1 to WL4) and the columnar semiconductor layers 43 (bit-lines BL) have varied characteristics.

According to this embodiment, according to the tapered shapes of the columnar semiconductor layers 43, the upper layers of the conductive layers 42a to 42d have larger Z-direction thicknesses. Therefore, facing areas in which the conductive layers 42a to 42d and the columnar semiconductor layers 43 are in contact with each other may have be generally constant.

In addition, the voltage adjustment circuits 121 and 131 in this embodiment may change, according to the Z-direction positions of the word-lines WL (the conductive layers 42), the voltages applied to the word-lines WL and the corresponding bit-lines BL. For example, the voltages applied to the word-lines WL1 to WL4 are determined according to the results of test writes. Here, each test write is, for example, an operation to apply a voltage to a word-line WL and the corresponding bit-line BL and detect the resulting resistance change of the variable resistance element VR. For example, a tester or an internal test circuit selects some of the variable resistance elements VR connected to the word-lines WL1 to WL4, and performs a set or reset operation thereto. As a result, the tester or the internal test circuit calculates the resistance variation for each of the word-lines WL1 to WL4. That is, the test write results appear as the resistance variations of each variable resistance element VR caused by the test write. The test write results may be stored in the ROM region 14 of the semiconductor memory device or the like.

With reference again to FIG. 3, a description is given of how the voltage adjustment circuit 121 changes the voltage of a word-line WL according to the Z-direction position thereof, as described above. A voltage is transferred to a word-line WL with the path circuit 121a rendered conductive. As the path circuit 121a includes the n-type transistor nTa and the p-type transistor pTa, the circuit 121a may transfer voltages from 0 V to a set or reset voltage (higher than 0 V). When, a voltage is transferred from a wiring line W to a word-line WL, the voltage applied to the gates of the n-type transistor nTb and the p-type transistor pTb in the path circuit 121b is changed according to the Z-direction position of the word-line WL. For example, consider a case where the resistance of the variable resistance element VR connected to the word-line WL4 is higher than the resistance of the variable resistance element VR connected to the word-line WL1. In this case, the control circuit 15 increases, when the variable resistance element VR connected to the word-line WL1 is selected, the voltage drop of the path circuit 121b. That is, the path circuit 121b changes the voltage drop according to the Z-direction position of the word-line WL, and then transfers the voltage of the wiring line W to the word-line WL. Thus, according to the Z-direction position of the word-line WL, the voltage applied to the word-line WL is changed. Note that how the voltage adjustment circuit 131 changes the voltage of a bit-line BL is generally the same as in the voltage adjustment circuit 121, and its description is omitted here.

Here, if the conductive layers 42a to 42d have different Z-direction thicknesses, the grain boundaries of the conductive layers 42a to 42d may have different properties. Therefore, even if the conductive layers 42a to 42d (word-lines WL1 to WL4) are applied with the same voltage for the set and reset operations, the variable resistance layers 44 (variable resistance elements VR) may have variations in the resistance. Even in such a case, in this embodiment, the voltage changes of the word-lines WL or the bit-lines BL as described above may provide, despite of the Z-direction position of the word-lines WL, a uniform change of the resistance of the variable resistance elements VR in the set and reset operations.

In addition, even if the conductive layers 42a to 42d (word-lines WL1 to WL4) are applied with the same voltage for the read operation, the variable resistance layers 44 (variable resistance elements VR) have the resistance variations. Even in such a case, in this embodiment, the voltage changes of the word-lines WL or the bit-lines BL as described above may provide, despite of the Z-direction position of the word-line WL, a correct read of the resistance of the variable resistance elements VR in the read operation.

Note that in the above embodiment, the upper layers of the conductive layers 42a to 42d have larger Z-direction thicknesses. Note that even if the conductive layers 42a to 42d have a uniform thickness, this embodiment may be applicable.

[Second Embodiment]

Figure 8:
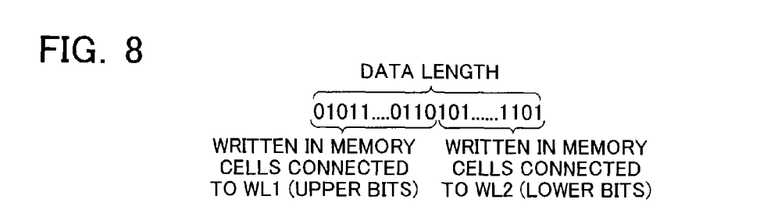
FIG. 8 shows an example of one data length written in a semiconductor memory device according to a second embodiment.
Figure 9:
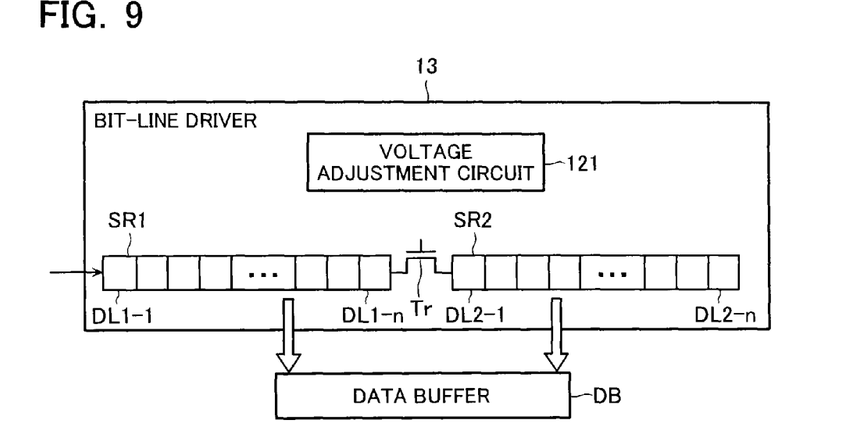
FIG. 9 shows an example of a word-line driver 12 according to the second embodiment.

With reference now to FIG. 8 and FIG. 9, a semiconductor memory device according to a second embodiment will be described. The semiconductor memory device according to the second embodiment includes the voltage adjustment circuits 121 and 131 as in the first embodiment. Meanwhile, in the second embodiment, the control circuit 15 has a configuration to select, when a data set is stored in a memory cell MC, a word-line WL according to the data code length, unlike the first embodiment.

The semiconductor memory device according to the second embodiment is mainly applicable when the data code length is larger than the number of global bit-lines GBL. For example, with reference to FIG. 8, when the data code length is larger than the number of global bit-lines GBL, the semiconductor memory device according to the second embodiment selects the word-line WL1 and writes a part of the data set in the memory cells MC connected to the word-line WL1, and also selects the word-line WL2 and writes a remaining part of the data set in the memory cells MC connected to the word-line WL2.

To perform the above control, with reference to FIG. 9, a bit-line driver 13 according to the second embodiment includes shift registers SR1 and SR2 and a transistor Tr. The shift registers SR1 and SR2 include a plurality of data latches DL1-1 to DL1-n and DL2-1 to DL2-n, respectively. The number of bits storable in the shift register SR1 or SR2 (i.e., the number n of data latches DL) is equal to the number of global bit-lines GBL in the memory cell array 11. Note that when the memory cell array 11 is divided into a plurality of blocks, the number of global bit-lines GBL in the memory cell array 11 may be the number of global bit-lines GBL in one block.

Here, an example is described where data sets are input in the shift registers SR1 and SR2. The code length of one data set (one data length) is input in the data latch DL1-1 of the shift register SR1. For example, one data set at a time is sequentially input in the shift register SR1 from the outside according to a clock pulse. That is, the data set input in the shift register SR1 is sequentially moved from the data latch DL1-1 to the data latch DL1-2, . . . , the data latch DL1-n according to a clock pulse.

If the control circuit 15 determines that the data code length is smaller than the number of bits storable in the shift register SR1 or SR2 (the data code length is smaller than the number of global bit-lines GBL), the transistor Tr is rendered non-conductive state. As a result, one data length is entirely input in the shift register SR1.

Meanwhile, if the control circuit 15 determines that the data code length is larger than the number of bits storable in the shift register SR1 or SR2 (the data code length is larger than the number of global bit-lines GBL), the transistor Tr is rendered conductive state. That is, it may be recognized that the number of data latches DL of the shift register is extended. After one data length is input in all data latches DL1-1 to DL1-n of the shift register SR1, the data set is transferred from the data latch DL1-n of the shift register SR1 to the data latch DL2-1 of the shift register SR2 via the transistor Tr according to a clock pulse, for example. At the same time, a portion of the data set of one data length that has not been input in the data latches of the shift register SR1 is input from the data latch DL1 of the shift register SR1 according to a clock pulse. Then, the data set is input until one data length is entirely stored in the shift registers SR1 and SR2.

The control circuit 15 moves the data set SR1D input in the shift register SR1 to the data buffer DB. The data buffer DB includes a plurality of data latches. The data latches of the data buffer DB are connected to the respective global bit-lines GBL. The data set SR1D is stored in the data latches of the data buffer DB. Then, the control circuit 15 selects, for example, the word-line WL1 and writes the data set SR1D in the memory cells MC connected to the word-line WL1 through the global bit-lines GBL.

Here, if the code length of one data set is larger than the number of global bit-lines GBL, a portion of one data length is also stored in the shift register SR2. Then, the control circuit 15 moves the data set SR2D input in the shift register SR2 to the data buffer DB. The data set SR2D is stored in the data latches of the data buffer DB. Then, the control circuit 15 selects, for example, the word-line WL2 and writes the data set SR2D in the memory cells MC connected to the word-line WL2 through the global bit-lines GBL. FIG. 8 shows an example where the upper bits "01011 . . . 0110" input in the shift register SR1 are written in the memory cells MC connected to the word-line WL1. In addition, the lower bits "101 . . . 1101" input in the shift register SR2 are written in the memory cells MC connected to the word-line WL2.

As a result, even if the code length of one data set is larger than the number of global bit-lines GBL, a data set may be stored in the memory cells MC connected to the word-lines WL. Here, the method of writing data according to the first embodiment is easily applicable to the second embodiment. For example, consider a case where the control circuit 15 stores the data set SR1D input in the shift register SR1 in the memory cells MC connected to the word-line WL1, and stores the data set SR2D input in the shift register SR2 in the memory cells MC connected to the word-line WL2, which is disposed in a higher level than the word-line WL1.

The control circuit 15 changes the voltages of the word-lines WL or the bit-lines BL between when the data set SR1D is written in the word-line WL1 and when the data set SR2D is written in the word-line WL2. As a result, even if the code length of a data set is larger than the number of global bit-lines GBL, the second embodiment may correctly store the data set in memory cells MC.

[Third Embodiment]

A semiconductor memory device according to a third embodiment will now be described. With the above stacked structure, the variable resistance element VR has different data stored characteristics depending on the Z-direction position. Then, with reference to FIG. 10, the semiconductor memory device according to the third embodiment includes ECC circuits 16[1] to 16[k] and a selection circuit 17. K is an integer of two or more. Here, the ECC circuits 16[1] to 16[k] have different correcting capabilities. For example, the correcting capability increases in the order of the ECC circuit 16[1], the ECC circuit 16[2], . . . , and the ECC circuit 16[k].

Figure 10:
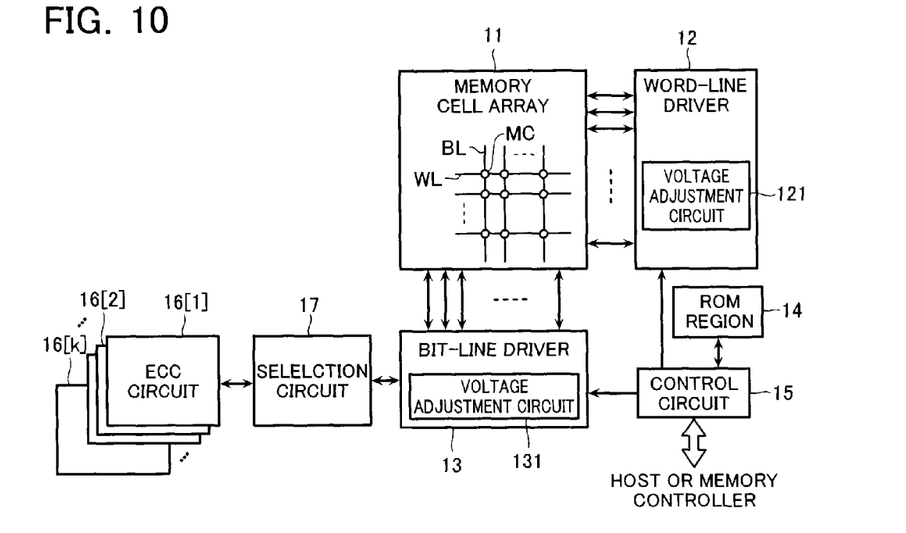
FIG. 10 is an example block diagram of a semiconductor memory device according to a third embodiment.

The ECC circuits 16[1] to 16[k] have different schemes for correcting data error. For example, the memory cells connected to the word-lines WL1 to WL4 have different properties. That is, there may be any cases including the case where the memory cells connected to lower word-lines WL have poor properties, the case where the memory cells connected to middle word-lines WL have poor properties, and the case where the memory cells connected to upper word-lines WL have poor properties.

Then, the selection circuit 17 selects, according to the Z-direction position of the selected word-line WL, one of the ECC circuits 16[1] to 16[k] used for the error correction. With the ECC circuits 16[1] to 16[k] and the selection circuit 17, the third embodiment may perform, according to the data stored characteristics of the variable resistance element VR, the error correction correctly.

In addition, the method of writing data according to the first embodiment is easily applicable to the third embodiment. For example, consider a case where the control circuit 15 reads data from the memory cells MC connected to the word-line WL1 and the word-line WL2, which is disposed in a higher level than the word-line WL1. The control circuit 15 selects the word-line WL1 and reads the voltages of the word-lines WL or the bit-lines BL in a first condition. The selection circuit 17 selects the ECC circuit 16[1] for the error correction. Then, the control circuit 15 selects the word-line WL2 and reads the voltages of the word-lines WL or the bit-lines BL in a second condition different from the first condition. The selection circuit 17 selects the ECC circuit 16[2] for the error correction.

As described above, the control circuit 15 changes the voltages of the word-lines WL or the bit-lines BL between when data is read from the word-line WL1 and when data is read from the word-line WL2, and the selection circuit 17 may select the ECC circuit 16 corresponding to the selected word-line. As described above, the control circuit 15 and the selection circuit 17 are operated according to the selected word-line WL so that data may be correctly read according to the data stored characteristics of the variable resistance element VR. Note that although the third embodiment has been described with respect to the data read, it is also applicable to the data write.

[Fourth Embodiment]

Figure 11:
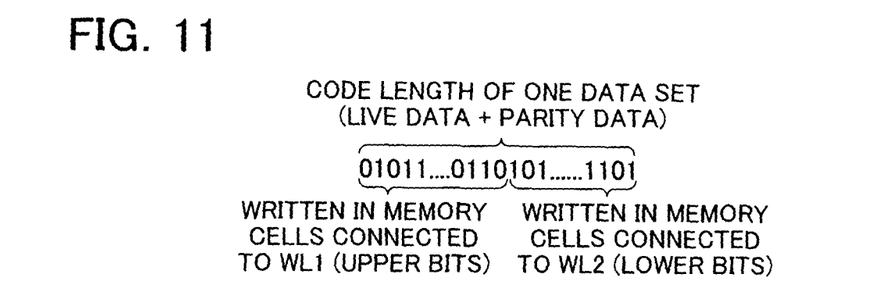
FIG. 11 shows an example of one data length written in a semiconductor memory device according to a fourth embodiment.

With reference now to FIG. 11, a semiconductor memory device according to a fourth embodiment will be described. The semiconductor memory device according to the fourth embodiment includes the ECC circuits 16[1] to 16[k] and the selection circuit 17. These structures are the same as the third embodiment. Meanwhile, in the fourth embodiment, the control circuit 15 has a configuration to select, when a data set is stored in a memory cell MC, a word-line WL according to the data code length, unlike the third embodiment.

The semiconductor memory device according to the fourth embodiment is mainly applicable when the code length of one data set including live data and parity data is larger than the number of global bit-lines GBL. For example, with reference to FIG. 11, when the code length of one data set is larger than the number of global bit-lines GBL, the semiconductor memory device according to the fourth embodiment selects the word-line WL1 and writes apart of the data set in the memory cells MC connected to the word-line WL1, and also selects the word-line WL2 and writes a remaining of the data set in the memory cells MC connected to the word-line WL2.

To perform the above control, a bit-line driver 13 according to the fourth embodiment has a similar configuration to that in FIG. 9.

Here, if the code length of one data set is larger than the number of global bit-lines GBL, the shift register SR2 stores a part of the code length of one data set. Then, the control circuit 15 moves the data set SR2D input in the shift register SR2 to the data buffer DB. The data set SR2D is stored in the data latches of the data buffer DB. Then, the control circuit 15 selects, for example, the word-line WL2 and writes the data set SR2Da in the memory cells MC connected to the word-line WL2 through the global bit-lines GBL. FIG. 11 shows an example where the upper bits "01011 . . . 0110" input in the shift register SR1 are written in the memory cells MC connected to the word-line WL1. In addition, the lower bits "101 . . . 1101" input in the shift register SR2 are written in the memory cells MC connected to the word-line WL2.

As a result, even if the code length of one data set is larger than the number of global bit-lines GBL, a data set may be stored in the memory cells MC connected to the word-lines WL. Here, the method of writing data according to the first embodiment is easily applicable to the fourth embodiment. For example, consider a case where the control circuit 15 stores the data set SR1D input in the shift register SR1 in the memory cells MC connected to the word-line WL1, and stores the data set SR2Da input in the shift register SR2 in the memory cells MC connected to the word-line WL2, which is disposed in a higher level than the word-line WL1.

The control circuit 15 changes the voltages of the word-lines WL or the bit-lines BL between when the data set SR1D is written in the word-line WL1 and when the data set SR2D is written in the word-line WL2. As a result, even if the code length of a data set is larger than the number of global bit-lines GBL, the fourth embodiment may correctly store the data set in memory cells MC.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array comprising first wiring lines, and second wiring lines, the first and second wiring lines intersecting, and memory cells disposed in the intersections of the first and second wiring lines, memory cells having a variable resistance element; and
a control circuit configured to control voltages of selected first and second wiring lines,
the first wiring lines being arranged at a first pitch in a first direction perpendicular to a substrate, the first wiring lines extending in a second direction parallel to the substrate,
the second wiring lines being arranged at a second pitch in the second direction, the second wiring lines extending in the first direction,
the control circuit configured to change voltages applied to a selected first wiring line of the first wiring lines according to the positions of the selected first wiring lines in the first direction, and
the memory cell array further comprising:
a selection transistor having a first end connected to one end of the second wiring lines;
a select gate line connected to a gate of the selection transistor; and
a fourth wiring line connected to a second end of the selection transistor.

2. The semiconductor memory device according to claim 1, wherein
the control circuit configures to decide, when data is stored in a memory cell, the select first wiring line according to a code length of the data.

3. The semiconductor memory device according to claim 2, wherein
the control circuit comprises:
a first shift register configured to store a first part of data;
a second shift register configured to store a second part of the data; and
a switch provided between the first and second shift registers.

4. The semiconductor memory device according to claim 1, wherein
the control circuit comprises:
ECC circuits configured to correct a data error and having a different correcting capability from one another; and
a selection circuit configured to select one of ECC circuits used for an error correction according to the position of the selected first wiring line in the first direction.

5. The semiconductor memory device according to claim 4, wherein
the control circuit configures to select memory cells to store data according to data code length.

6. The semiconductor memory device according to claim 5, wherein
the control circuit comprises:
a first shift register configured to store a part of data;
a second shift register configured to store another part of the data; and
a switch provided between the first and second shift registers.

7. The semiconductor memory device according to claim 1, wherein
the control circuit comprises:
a third wiring line supplied with a first voltage; and
a pass transistor connected between the selected first wiring line and the third wiring line,
the control circuit being configured to change a voltage applied to a gate of the pass transistor according to the position of the selected first wiring line in the first direction.

8. The semiconductor memory device according to claim 1, wherein
the memory cell array comprises:
conductive layers functioning as the first wiring lines;
a variable resistance layer provided in common on side surfaces of the conductive layers as the variable resistance elements; and
column conductive layers being in contact with side surfaces of the conductive layers via the variable resistance layer as the second wiring lines.

9. The semiconductor memory device according to claim 8, wherein
the conductive layers are formed in a comb shape when viewed in the first direction.

10. A semiconductor memory device comprising:
a memory cell array comprising first wiring lines, and second wiring lines, the first and second wiring lines intersecting, and memory cells disposed in the intersections of the first and second wiring lines, memory cells comprising a variable resistance element; and
a control circuit configured to control voltages of selected first and second wiring lines,
the first wiring lines being arranged at a first pitch in a first direction perpendicular to a substrate, the first wiring lines extending in a second direction parallel to the substrate,
the second wiring lines being arranged at a second pitch in the second direction, the second wiring lines extending in the first direction, and
the control circuit comprising,
ECC circuits configured to correct a data error and having a different correcting capability from one another, and
a selection circuit configured to select one of ECC circuits used for an error correction according to the position of a selected first wiring line of the first wiring lines in the first direction.

11. The semiconductor memory device according to claim 10, wherein
the control circuit configured to select memory cells to store data according to data code length.

12. The semiconductor memory device according to claim 10, wherein
the control circuit comprises:
a first shift register configured to store a part of data;
a second shift register configured to store another part of the data; and
a switch provided between the first and second shift registers.

13. The semiconductor memory device according to claim 10, wherein
the memory cell array comprises:
conductive layers functioning as the first wiring lines;
a variable resistance layer provided in common on side surfaces of the conductive layers as the variable resistance elements; and
column conductive layers being in contact with side surfaces of the conductive layers via the variable resistance layer as the second wiring lines.

14. The semiconductor memory device according to claim 10, wherein
the memory cell array further comprises:
a selection transistor having a first end connected to one end of the second wiring lines;
a select gate line connected to a gate of the selection transistor; and
a fourth wiring line connected to a second end of the selection transistor.

15. The semiconductor memory device according to claim 14, wherein
the memory cell array comprises:
a second conductive layer extending in the second direction as the fourth wiring line;
a columnar semiconductor layer being in contact with an upper surface of the second conductive layer and with a lower surface of the column conductive layer as a body of the selection transistor;
a gate insulating layer provided on a side surface of the columnar semiconductor layer; and
a third conductive layer provided on the side surface of the columnar semiconductor layer via the gate insulating layer as a gate of the selection transistor.

* * * * *